US012637349B2

(12) United States Patent
Luan

(10) Patent No.: US 12,637,349 B2
(45) Date of Patent: May 26, 2026

(54) WAFER LEVEL CHIP SCALE PACKAGING WITH SENSOR

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 673 days.

(21) Appl. No.: 17/344,576

(22) Filed: Jun. 10, 2021

(65) Prior Publication Data

US 2021/0395077 A1 Dec. 23, 2021

Related U.S. Application Data

(60) Provisional application No. 63/042,247, filed on Jun. 22, 2020.

(51) Int. Cl.
B81B 7/00 (2006.01)
B81C 1/00 (2006.01)

(52) U.S. Cl.
CPC ........ B81B 7/0061 (2013.01); B81C 1/00309 (2013.01); *B81B 2201/0264* (2013.01); *B81B 2207/07* (2013.01)

(58) Field of Classification Search
CPC .......................... B81B 7/0061; B81C 1/00309
See application file for complete search history.

(56) References Cited

U.S. PATENT DOCUMENTS 9,156,673 B2 10/2015 Bryzek et al.
9,527,723 B2 12/2016 Lin et al.

9,628,919 B2 * 4/2017 Conti ..................... H10D 48/50
9,663,353 B2 5/2017 Ofner et al.
11,579,033 B2 * 2/2023 Boysel .................. G01L 9/0073
11,852,481 B2 * 12/2023 Boysel .............. G01C 19/5769
2008/0164543 A1 * 7/2008 Ziglioli ................ B81B 7/0061
257/415
2008/0179697 A1 * 7/2008 Cortese ................ B81B 7/0061
438/51
2011/0081739 A1 * 4/2011 Cortese .................. B81B 7/007
257/E21.705
2011/0092009 A1 * 4/2011 Ziglioli ................ B81B 7/0061
438/51
2012/0032285 A1 * 2/2012 Cortese .................. B81B 7/007
257/E29.166

(Continued)

FOREIGN PATENT DOCUMENTS

CN 104140071 A 11/2014
KR 10-1099582 B1 12/2011

*Primary Examiner* — Nathan W Ha

(74) *Attorney, Agent, or Firm* — Seed IP Law Group LLP

(57) ABSTRACT

The present disclosure is directed to a package (e.g., a chip scale package, a wafer level chip scale package (WLCSP), or a package containing a sensor die) with a sensor die on a substrate (e.g., an application-specific integrated circuit die (ASIC), an integrated circuit, or some other type of die having active circuitry) and encased in a molding compound. The sensor die includes a sensing component that is aligned with a centrally located opening that extends through the substrate. The centrally located opening extends through the substrate at an inactive portion of the substrate. The centrally located opening exposes the sensing component of the sensor die to an external environment outside the package.

20 Claims, 11 Drawing Sheets

(56)                     References Cited

U.S. PATENT DOCUMENTS

| 2013/0283912 A1* | 10/2013 | Lin ........................ G01L 13/025 |
| | | 73/717 |
| 2014/0070337 A1 | 3/2014 | Besling et al. |
| 2014/0117469 A1* | 5/2014 | Takahashi ............. B81C 1/0023 |
| | | 257/E21.602 |
| 2014/0319630 A1* | 10/2014 | Conti ................... H04R 19/005 |
| | | 257/416 |
| 2015/0001645 A1* | 1/2015 | Faralli ................. B81C 1/00269 |
| | | 438/53 |
| 2015/0001651 A1* | 1/2015 | Faralli ................... B81B 7/0016 |
| | | 438/51 |
| 2016/0159642 A1 | 6/2016 | Hooper et al. |
| 2017/0207182 A1 | 7/2017 | Ho et al. |
| 2018/0035548 A1 | 2/2018 | Landesberger et al. |

* cited by examiner

WAFER LEVEL CHIP SCALE PACKAGING WITH SENSOR

BACKGROUND

Technical Field

The present disclosure is directed to a package including a sensor die and an integrated circuit die.

Description of the Related Art

Generally, semiconductor device packages, such as chip scale packages or wafer level chip scale packages (WLCSP), contain dice, such as sensors configured to detect any number of quantities or qualities of an external environment outside the packages. For example, semiconductor device packages may detect light, temperature, sound, pressure, vibration, or any other quantities or qualities of the external environment outside the packages.

Stacking die on top of substrates, such as printed circuit boards (PCBs) or application-specific integrated circuit (ASIC) dies, results in relatively bulky packages. As demand increases for smaller packages while maintaining the functionality of the packages with cost-effective manufacturing, manufacturers are continually working on ways to reduce the size, profile, and thickness of semiconductor device packages.

In conventional semiconductor device packages with a sensor die, a cap is generally coupled to a substrate by an adhesive to cover and protect the sensor die. The cap significantly increases the overall profile, size, and thickness of these conventional semiconductor device packages. For example, conventional semiconductor device packages generally have an overall thickness of 800-μm to 1500-μm.

Additionally, the cap, the adhesive, the substrate, and the sensor die of the conventional semiconductor device packages have different coefficients of thermal expansion (CTE). These differences in CTEs result in the cap, the adhesive, the substrate, and the sensor die expanding and contracting by different amounts when exposed to changes in temperature, which may cause cracking and failure in these components. This expansion and contraction may result in the adhesive coupling the cap to the substrate cracking, which may lead to complete failure, such as the cap breaking off the conventional semiconductor device packages. This breaking off of the cap causes the conventional semiconductor packages to no longer be usable and useful.

Similarly, when shipping or moving these conventional semiconductor device packages, if the adhesive is not properly coupled between the cap and the substrate due to air gaps, bubbles, or other manufacturing defects, the cap may break off during shipment of these conventional semiconductor device packages due to vibrational stresses.

In addition, in conventional semiconductor device packages, if the sensor die is one of the above types of sensors listed out above, the cap generally includes an opening to expose the sensor die to an external environment. Again by utilizing the cap to protect the sensor die and to expose the sensor die to the external environment, the cap increases the profile, size, and thickness of the semiconductor device packages.

BRIEF SUMMARY

Embodiments of the present disclosure overcome significant challenges associated with semiconductor device packages that utilize a cap as discussed above. One significant challenge is to reduce the likelihood of failure in semiconductor device packages when exposed to temperature changes due to differences in coefficients of thermal expansion (CTEs) of various materials of semiconductor device packages.

The present disclosure is directed to various embodiments of semiconductor device packages including a sensor die having a sensing component on a substrate that is an integrated circuit die that includes an opening centrally located and extending through the integrated circuit die.

In one embodiment, the sensing component is aligned with the centrally located opening that extends through the substrate. The sensor die is coupled to a surface of the substrate by a plurality of first conductive structures coupled between contact pads on the sensor die and contact pads on the substrate. The sensor die is further coupled to the surface of the substrate by a second conductive structure on a ring contact pad of the sensor die. The second conductive structure and the ring contact pad surround the opening in the substrate and the sensing component of the sensor die.

In one embodiment, a method of manufacturing the second conductive structure is formed on the ring contact pad of the sensor die. The second conductive structure is then reflowed to be coupled between the ring contact pad and the substrate. A molding compound layer is formed on the substrate to encase the sensor die. However, the second conductive structure stops the molding compound from reaching or filling the opening of the substrate, or from covering the sensing component. In other words, the second conductive structure acts as a dam or a boundary to protect the opening and the sensing component while the molding compound layer is being formed.

In view of the above, the cap of the conventional semiconductor device packages is no longer required. By removing the need for the cap with the opening in the cap to expose the sensor die of the conventional semiconductor device packages, the one embodiment of the package of the present disclosure is made smaller and thinner relative to the conventional semiconductor device packages. For example, the semiconductor packages of the present disclosure generally have a thickness ranging from 100-μm to 400-μm, which is much less than the thickness of the conventional semiconductor device packages with the cap, which have thicknesses that generally range from 800-μm to 1500-μm.

Also, by removing the cap to be coupled to the substrate by the adhesive in the conventional semiconductor device packages, the useful lifespan of the embodiments of the packages of the present disclosure are increased. The useful lifespan is increased as there is lower likelihood of the packages of the present disclosure having components break off due to differences in expansion and contraction.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative proportions of the elements in the drawings are not necessarily drawn to scale. For example, some of these elements may be enlarged and positioned to improve drawing legibility.

FIGS. 5A-5J are a flowchart of a method of manufacturing the package in FIGS. 1A-1B;

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

While various embodiments are shown and described with respect to semiconductor die and semiconductor packages, it will be readily appreciated that embodiments of the present disclosure are not limited thereto. In various embodiments, the structures, devices, methods and the like described herein may be embodied in or otherwise utilized in any suitable type or form of semiconductor die or packages, and may be manufactured utilizing any suitable semiconductor die and packaging technologies as desired.

Figure 1A:
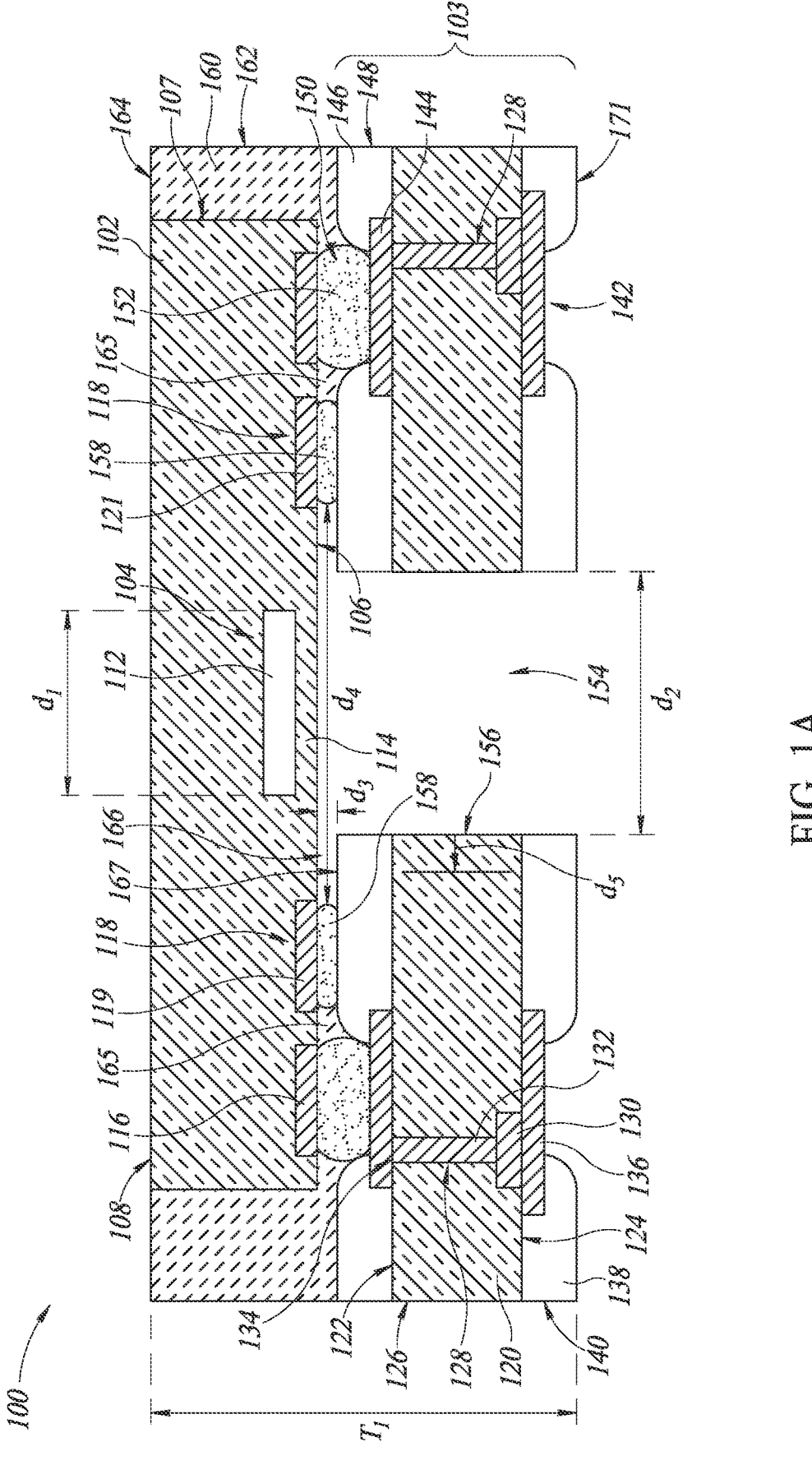
FIG. 1A is a cross-sectional view of an embodiment of a package taken along line 1A-1A in FIG. 1B and line CC-CC in FIG. 3.
Figure 1B:
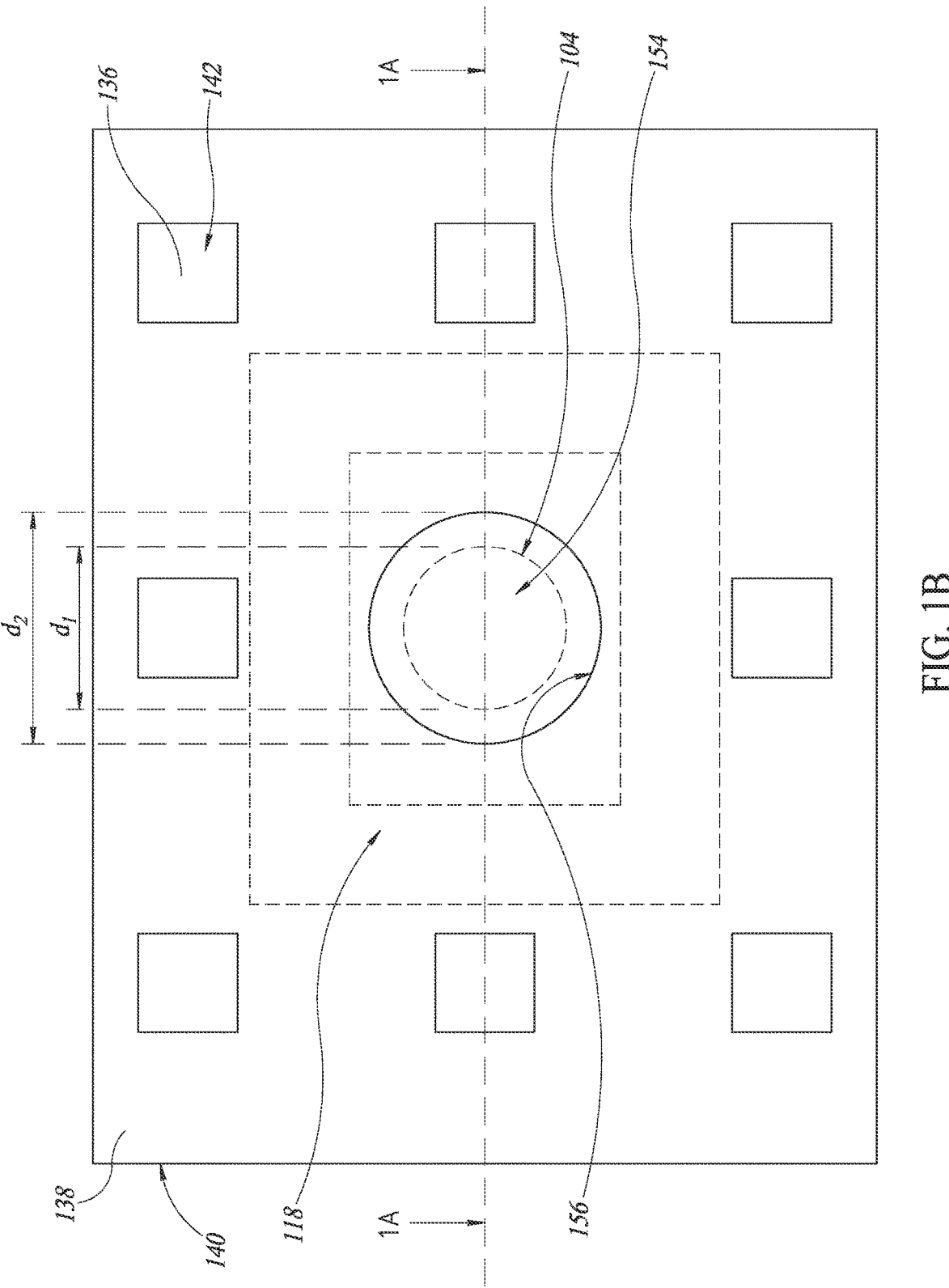
FIG. 1B is a bottom-plan view of the embodiment of the package in FIG. 1A.
Figure 3:
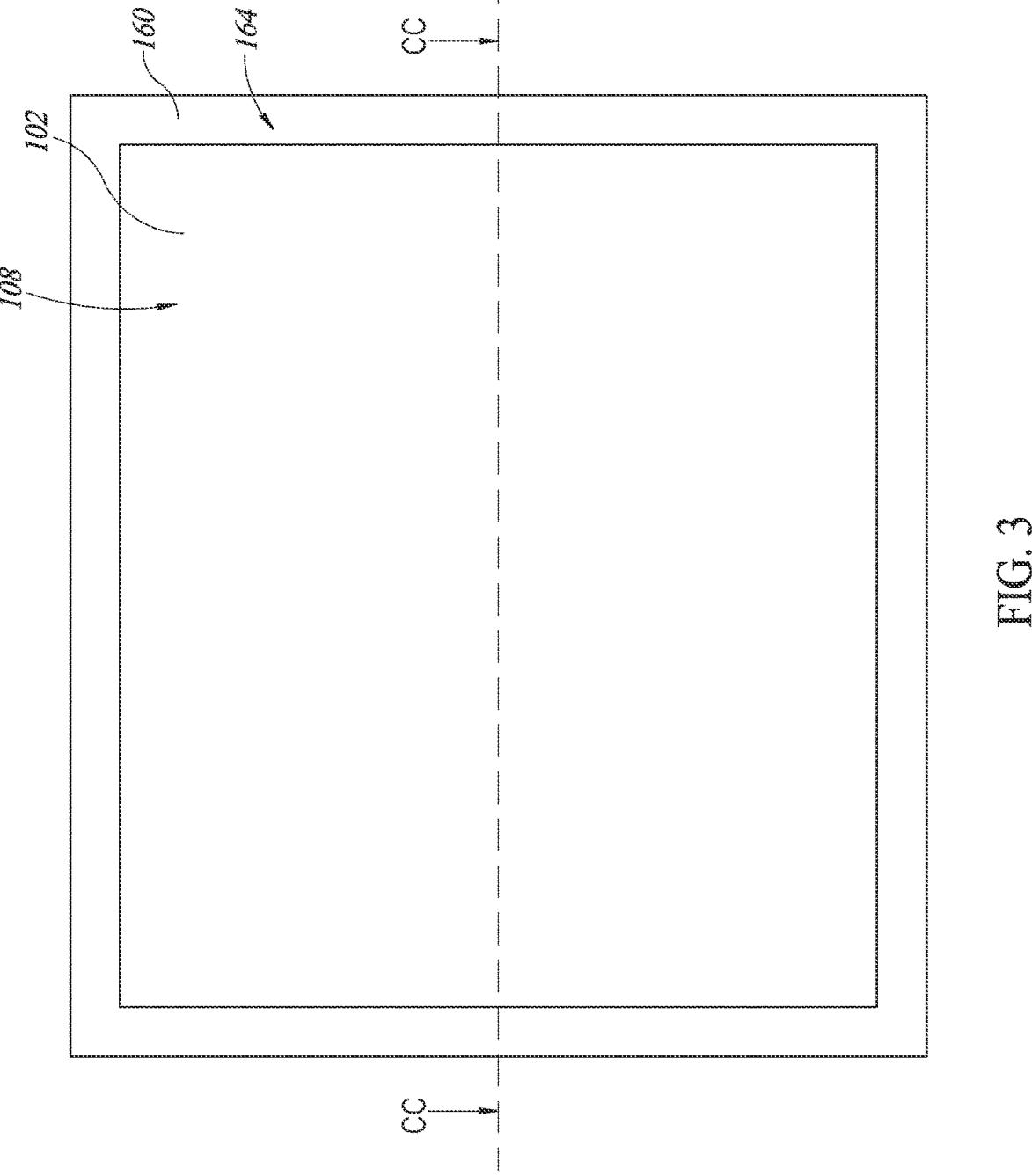
FIG. 3 is a top plan view of embodiments of the packages in FIGS. 1A-1B and 2.

FIG. 1A is a cross-sectional view of an embodiment of a package 100 taken along line 1A-1A in FIG. 1B and line CC-CC in FIG. 3. This may be a wafer level chip scale package that includes a sensor die 102 coupled to an integrated circuit die 103. The die 102 includes a sensing component 104 positioned between a first surface 106 and a second surface 108 opposite to the first surface 106. The integrated circuit die 103 includes a centrally positioned opening 154 aligned with the sensing component that will be described in greater detail below.

The sensor die 102 includes sidewalls 107 that are transverse to the first surface 106 and the second surface 108. The sidewalls 107 extend between the first surface 106 and the second surface 108. The sensing component 104 is at the first surface 106 of the die 102 or otherwise closer to the first surface 106 than the second surface. The sensing component 104 is closer to the first surface so that the sensing component can receive data or collect information about the environment in which the package 100 is placed.

The die 102 may be a pressure sensor, a temperature sensor, a sound sensor, a vibrational sensor, or some other type of sensor or combination of sensors. The sensing component 104 may sense pressure, temperature, sound, vibration, or some other type of quantity or quality or combination of quantities or qualities. For example, the sensing component 104 may be a micro-electromechanical system (MEMS) pressure sensor, which may be a membrane pressure sensor or a cantilever beam pressure sensor. The membrane or beam is aligned with the opening 154 in the integrated circuit die so that vibrations, for example, can move through the opening from an environment to be received by the membrane or beam at or near the first surface 106.

The sensing component 104 could be a capacitive sensing component, which may be a membrane pressure sensor. A cavity 112 is positioned within the die and a membrane 114 extends across the cavity. The membrane 114 may be a movable electrode, such that one edge of the membrane is floating and another edge of the membrane is coupled to the die at an edge or side of the cavity 112. The cavity 112 has a dimension $d_1$ that extends across the cavity 112. The membrane may extend the full dimension or may extend partially across the cavity.

In use, the membrane 114 is deflected or moved when exposed to a change in pressure. For example, the membrane 114 bends inward toward the cavity 112 when pressure increases or bends outward away from the cavity 112 when pressure decreases. The membrane 114 may be in capacitive electrical communication with an electrode of the sensing component that monitors the deflection of the membrane 114. The electrode (not shown) may be positioned adjacent to an interior surface of the cavity 112 that is closer to the second surface than the membrane 114. For example, as the membrane 114 bends inward or outward due to a change in pressure the capacitance between the electrode and the membrane 114 changes. This change in capacitance between the membrane 114 and the electrode allows for pressure measurements to be measured and monitored. In some embodiments, the membrane 114 may be in capacitive electrical communication with a doped region of the sensing component 104.

The die 102 includes a plurality of contacts 116 at the first surface 106 of the die 102 that are positioned around the opening and the sensing component 104. The plurality of contacts 116 are coupled to electrical and conductive components within the die 102. For example, one contact of the plurality of contacts 116 may be coupled to the sensing component 104 through internal electrical connections. The internal electrical connections may be electrical traces, electrical wiring, conductive layers, conductive vias, or some other electrical connection or combination of electrical connections. The plurality of contacts 116 are formed of an electrically conductive material such as a copper material, a gold material, a silver material, an alloy material, or some other conductive material or combinations of conductive material.

The die 102 includes a ring contact pad 118 at the first surface 106 of the die 102 that surrounds the sensing component 104. The ring contact pad 118 includes a first portion 119 on a first side of the opening 154 and a second portion 121 on a second side of the opening 154. The first side of the opening 154 is on the left-hand side of the package 100 as shown in FIG. 1A, and the second side of the opening 154 is on the right-hand side of the package 100 as shown in FIG. 1A. A shape and position of the ring contact pad 118 can be seen in FIG. 2 and FIG. 5F and will be discussed in greater detail with respect to FIG. 5F. The ring contact pad 118 is coupled to a structure 158 that surrounds and seals a cavity 166, which is in fluid communication with both the opening 154 and the sensing component 104. The structure 158 may be made of a solder material or some other electrically conductive material. The cavity 166 may be an opening, a space, or some other void, gap, or equivalent that is in fluid communication with the opening 154. The cavity 166 is formed in an area between the sensor 102 and the integrated circuit die 103. Boundaries of the cavity are the first surface 106, an interior surface of the structure 158, and a surface 167 of a non-conductive layer 146.

In some embodiments, the ring contact pad 118 may be a dummy contact that is not coupled to any internal electrical components or electrical connections within the die 102. When the ring contact pad 118 is a dummy contact, the dummy contact does not communicate electrical signals to and from the die 102. Alternatively, in some other embodiments, the ring contact pad 118 may be coupled to internal electrical components and electrical connections within the die 102 such that signals are communicated to and from the die 102 through the ring contact pad 118. The ring contact pad 118 is formed of an electrically conductive material such as a copper material, a gold material, a silver material, an alloy material, or some other conductive material or combination of conductive materials. The ring contact pad 118 could be other shapes besides a ring. The contact pad 118 surrounds the sensor component to provide a seal with the structure 158 to create the cavity 166 that is coupled to the opening 154. The seal includes no openings through which fluid could pass in a lateral direction, while allowing the fluid to move through the opening 154 into the sensor and cavity 112.

The first surface 106 of the die 102 may be referred to as an active surface, and the second surface 108 of the die 102 may be referred to as a passive surface.

The integrated circuit die 103 includes a substrate 120 that includes a first surface 122, a second surface 124 opposite to the first surface 122, and sidewalls 126 that extend from the first surface 122 to the second surface 124. The substrate 120 may be a silicon substrate with dielectric layers, conductive layers, and non-conductive layers stacked on each other to from the integrated circuit. The integrated circuit includes a plurality of active and passive components formed in the substrate, such as transistors, resistors, capacitors, and other circuit elements to form the circuitry. The integrated circuit includes circuitry configured to receive the data from the sensor, process the data, and output information about the data to other devices.

A plurality of electrical connections 128 in the substrate 120 extend from the first surface 122 of the substrate 120 to the second surface 124 of the substrate 120. The first surface 122 is a passive surface of the integrated circuit. In some embodiments, the passive surface will be a back side of a wafer, i.e. a silicon or semiconductor surface. The second surface 124 of the integrated circuit is an active surface that includes the electrical connections 128. Some electrical connections, not shown in FIG. 1A are coupled to the circuitry and components within the integrated circuit, which can include a power and ground line, and other input/output connections. A plurality of layers of conductive materials and dielectric materials are formed in the integrated circuit to make the circuitry. These layers of conductive and dielectric materials are coupled to ones of the electrical connections.

Ones of the electrical connection 128 include a pad 130 at the second surface 124 of the substrate 120 and a via 132 coupled to the pad 130. The via 132 may be a conductive via, a through via, through connection, or some other conductive feature to be utilized in forming the electrical connections 128. The pad 130 may be a contact, a contact pad, or some other conductive feature to be utilized in forming the electrical connections 128. The via 132 extends from the pad 130 to the first surface 122 of the substrate 120. The via 132 has an end 134 at the first surface 122 of the substrate 120. The end 134 may be substantially co-planar or flush with the first surface 122 of the substrate 120.

A plurality of first conductive layers 136 is on the second surface 124 of the substrate 120. Each first conductive layer 136 is on a corresponding pad 130 of the plurality of electrical connections 128. The plurality of first conductive layers 136 may be referred to as a plurality of first contacts, a plurality of first pads, a plurality of first external contacts, a plurality of first mounting contacts, or some other type of contact, pad, or coupling/mounting feature to which a conductive material is coupled. The first conductive layers 136 may be part of a redistribution layer or other standard solder ball coupling techniques.

A first non-conductive layer 138 is on the second surface 124 of the substrate 120 and is on the plurality of first conductive layers 136. The first nonconductive layer 138 includes sidewalls 140 that are substantially coplanar or substantially flush with the sidewalls 126 of the substrate 120. The first nonconductive layer 138 includes a plurality of openings 142 that expose the plurality of first conductive layers 136. Each opening 142 is aligned with at least one of the first conductive layers 136. In some embodiments, at least one of the openings 142 may be aligned with and expose multiple of the first conductive layers 136 of the plurality of first conductive layers 136.

A plurality of second conductive layers 144 is on the first surface 122 of the substrate 120. Each second conductive layer 144 is on a corresponding end 134 of the plurality of electrical connections 128. The plurality of second conductive layers 144 may be referred to as a plurality of second contacts, a plurality of second pads, a plurality of second external contacts, a plurality of second mounting contacts, or some other type of contact, pad, or coupling/mounting feature.

A second non-conductive layer 146 is on the first surface 122 of the substrate 120 and is on the plurality of second conductive layers 144. The second nonconductive layer 146 includes sidewalls 148 that are substantially coplanar or substantially flush with the sidewalls 126, 140 of the substrate 120 and the first non-conductive layer 138, respectively. The second non-conductive layer 146 includes a plurality of openings 150 that expose the plurality of second conductive layers 144. Each opening 150 is aligned with at least one of the second conductive layers 144. In some embodiments, at least one of the openings 150 may be aligned with and expose multiple of the second conductive layers 144. The first and second nonconductive layer may be formed of an insulating material, a dielectric material, a passivation material, a re-passivation material, or some other electrically insulating material or combination of electrically insulating materials.

A plurality of conductive structures 152 is on the plurality of contacts 116. The plurality of conductive structures 152 may be a plurality of solder balls formed of a conductive material such as a solder material. Each conductive structure 152 is in a corresponding opening 150 in the second non-conductive layer 146. The plurality of conductive structures 152 extend from the plurality of second conductive layers 144 to the plurality of contacts 116 at the first surface 106 of the die 102. Each conductive structure 152 couples a corresponding second conductive layer 144 to a corresponding contact 116 of the die 102. The conductive structures 152 electrically couple the plurality of second conductive layers 144 to the plurality of contacts 116 such that electrical signals may be communicated to and from the die 102. These electrical signals may be control signals, digital signals, analog signals, data signals, or some other type of signal or combination of signals to be communicated to and fro the die 102. Electrical signals received by the die 102 may be control signals from an external controller or signals received from a memory. Electrical signals output by the die 102 may be data signals to be sent to an external controller or to a memory.

An opening 154 extends through the first non-conductive layer 138, the substrate 120, and the second non-conductive layer 146 of the integrated circuit die 103. The opening 154 further includes a sidewall 156 that is formed of the first non-conductive layer 138, the substrate 120, and the second non-conductive layer 146. The opening 154 has a dimension $d_2$ that extends across the opening 154. The dimension $d_2$ is greater than the dimension $d_1$ of the cavity 112. The dimension $d_2$ may be a diameter of the openings 154.

The opening 154 extends through a central region of the integrated circuit 103. This central region does not include any active circuitry. A distance d5 from the sidewall 156 into the integrated circuit 103 is free of active circuitry.

The conductive structure 158 is on the second non-conductive layer 146. The conductive structure 158 extends from the second non-conductive layer 146 to the contact 118. The conductive structure 158 is coupled to the contact 118 and the non-conductive layer 146. The conductive structure 158 surrounds the sensing structure 114 and the opening 154 that extends through the integrated circuit die 103. In this embodiment, the conductive structure 158 is formed of a conductive material such as a solder material, and may be referred to as a solder dam, a conductive dam, a solder structure, a conductive structure, a boundary structure, or some other type of structure formed around the opening 154 and the sensing component 104.

A molding compound 160 is on the second non-conductive layer 146. The molding compound 160 includes sidewalls 162 that are substantially coplanar or substantially flush with the sidewalls 126, 140, 148 of the substrate 120, the first non-conductive layer 138, and the second nonconductive layer 146, respectively. A surface 164 of the molding compound 160 is transverse to the sidewalls 162 of the molding compound 160. The surface 164 of the molding compound 160 is substantially coplanar or substantially flush with the second surface 108 of the die 102. The molding compound 160 covers the sidewalls 107 of the die 102 and is on the first surface 106 of the die 102. The molding compound 160 includes portions 165 between the conductive structure 158 and the plurality of conductive structures 152. The portions 165 of the molding compound 160 extend between the second non-conductive layer 146 and the first surface 106 of the die 102. The portions 165 of the molding compound 160 are on the conductive structure 158 and on the plurality of conductive structures 152. The portions 165 may be referred to as underfill portions of the molding compound 160. The molding compound 160 is stopped from entering the cavity 166 or the opening 154 by the conductive structure 158 such that cavity 166 and the opening 154 expose the sensing component 104 to an external environment outside the package 100.

The cavity 166 extends in a direction directed from the opening 154 to the conductive structure 158 and is between the opening 154 and the conductive structure 158. The cavity 166 has a dimension $d_3$ that extends between the second non-conductive layer 146 and the first surface 106 of the die 102. In this embodiment, the conductive structure 158 has the dimension $d_3$ as well. The cavity 166 has a dimension $d_4$ that extends across the cavity 166 and between the conductive structure 158. The dimension $d_4$ of the cavity 166 is greater than the dimension $d_2$ of the opening 154 and the dimension $d_1$ of the sensing component 104.

The package 100 has a thickness $T_1$ that extends from an exposed surface 171 of the non-conductive layer 138 to the surface 164 of the molding compound 160. The thickness generally is within the range of 100-μm to 400-μm. The integrated circuit 103 may be a thinned silicon die in that after processing and formation, excess portions of the silicon wafer are removed to form the surface 122.

In this embodiment, the substrate 120, the first non-conductive layer 138, the second non-conductive layer 146, the first conductive layers 136, and the second conductive layers 144 form the integrated circuit die 103. The integrated circuit 103 may be an application-specific integrated circuit (ASIC) die to which the die 102 is coupled.

FIG. 1B is a bottom plan view of the embodiment of the package 100 in FIG. 1A. The opening 154 has a center that is aligned with a center of the substrate 120, the first non-conductive layer 138, and the second non-conductive layer 146. In some embodiments, the center of the opening 154 may be offset from the center of the substrate 120, the first non-conductive layer 138, and the second non-conductive layer 146.

The opening 154 has a circular shape. In some other embodiments, the opening 154 may have a different shape than a circular shape such as a square shape, a rectangular shape, a triangular shape, or some other shape or combination of shapes.

The dotted line in FIG. 1B is representative of the cavity 112 of the sensing component 104 in the die 102. The opening 154 exposes the sensing component 104 of the die 102 to the external environment outside the package 100. For example, if the package 100 is mounted within an electronic device that utilizes the package 100, the opening 154 exposes the sensing component 104 of the die 102 to an internal environment of the electronic device, which the sensing component 104 monitors. For example, when the sensing component 104 is a pressure sensor as in this embodiment of the package 100, the sensing component 104 monitors the pressure within the internal environment of the electronic device.

The cavity 166 having the dimension d$_4$ being greater than the dimension d$_2$ of the opening 154 allows for the sensing component 104 to be exposed to a greater portion of an external environment outside the package 100, while keeping the opening 154 relatively small compared to the cavity 166, which reduces the chance of debris from reaching the sensing component 104 through the opening 154 at the same time.

Figure 2:
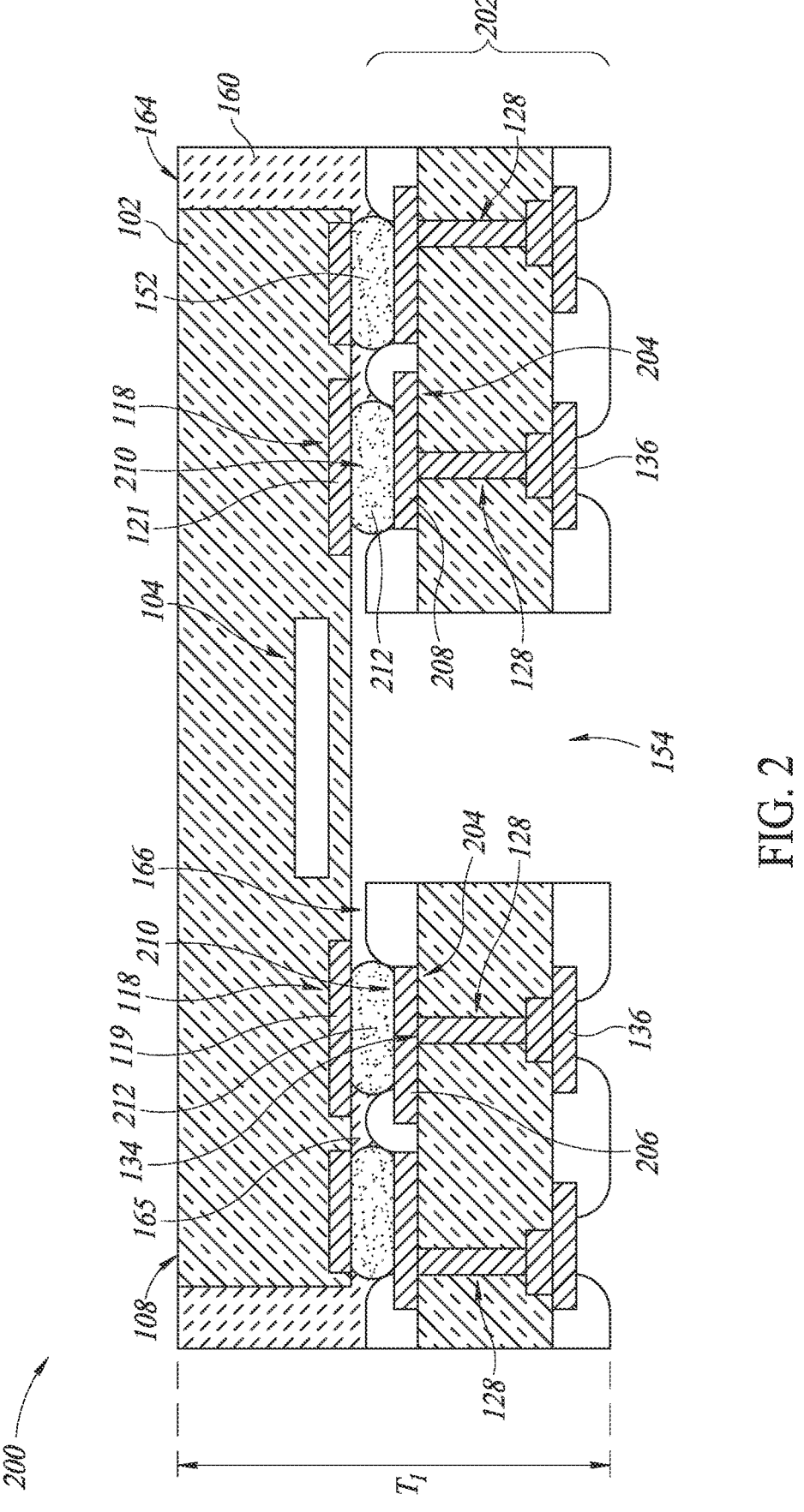
FIG. 2 is a cross-sectional view of an alternative embodiment of a package taken along line CC-CC in FIG. 3.

FIG. 2 is a cross-sectional view of an alternative embodiment of a package 200 taken along a line CC-CC in FIG. 3. The package 200 has similar features to the embodiment of the package 100 as shown in FIGS. 1A-1B. These similar features are represented by the same reference numerals as in FIG. 1A-1B. For brevity and simplicity sake, the present disclosure only discusses differences or new feature present in the package 200 in FIG. 2 in view of the features discussed with respect to FIGS. 1A-1B.

Unlike the integrated circuit die 103 of the embodiment of the package 100 in FIGS. 1A-1B, an integrated circuit die 202 in the alternative embodiment of the package 200 includes a ring contact pad 204 on the first surface 122 of the substrate 120 that is aligned with and coupled to the ring contact pad 118 of the die 102. The ring contact pads 118,204 have substantially the same shape as each other.

The ring contact pad 204 of the integrated circuit die 202 includes a third portion 206 on the first side of the opening 154 and a fourth portion 208 on the second side of the opening 154. The first side of the opening 154 is on the left-hand side of the package 200 as shown in FIG. 2, and the second side of the opening 154 is on the right-hand side of the package 200 as shown in FIG. 2. The third portion 206 of the ring contact pad 204 is aligned with the first portion 119 of the ring contact pad 118, and the fourth portion 208 of the ring contact pad 204 is aligned with the second portion 121 of the ring contact pad 118. The ring contact pad 204 is coupled at least one end 134 of the plurality of electrical connections 128. The plurality of electrical connections 128 are coupled to the first conductive layers 136.

An opening 210 in the second non-conductive layer 146 exposes the ring contact pad 204 of the integrated circuit die 202. The opening 210 has a shape substantially the same as the ring contact pads 118, 204 of the die 102 and the integrated circuit die 202, respectively.

A conductive structure 212 is in the opening 210 and extends from the ring contact pad 204 of the integrated circuit die 202 to the ring contact pad 118 of the die 102. The conductive structure 212 surrounds and seals the cavity 166, which is in fluid communication with both the opening 154 and the sensing component 104. The conductive structure 212 couples the ring contact pad 204 of the integrated circuit die 202 to the ring contact pad 118 of the die 102. The conductive structure 212 has a shape substantially the same as the ring contact pads 118, 204 of the die 102 and the integrated circuit die 202, respectively. The conductive structure 212 has a first portion on the first side of the opening 154 and a second portion on the second side of the opening 154.

The molding compound 160 includes portions 165 between the conductive structure 212 and the plurality of conductive structures 152. The portions 165 of the molding compound 160 extend between the second non-conductive layer 146 and the first surface 106 of the die 102. The portions 165 of the molding compound 160 are on the conductive structure 212 and on the plurality of conductive structures 152. The portions 165 may be referred to as underfill portions of the molding compound 160. The conductive structure 212 stops the molding compound 160 from filling the cavity 166 or the opening 154 when the molding compound 160 is formed. The molding compound 160 is stopped from entering the cavity 166 or the opening 154 by the conductive structure 212 such that cavity 166 and the opening 154 expose the sensing component 104 to an external environment outside the package 200.

Figure 4:
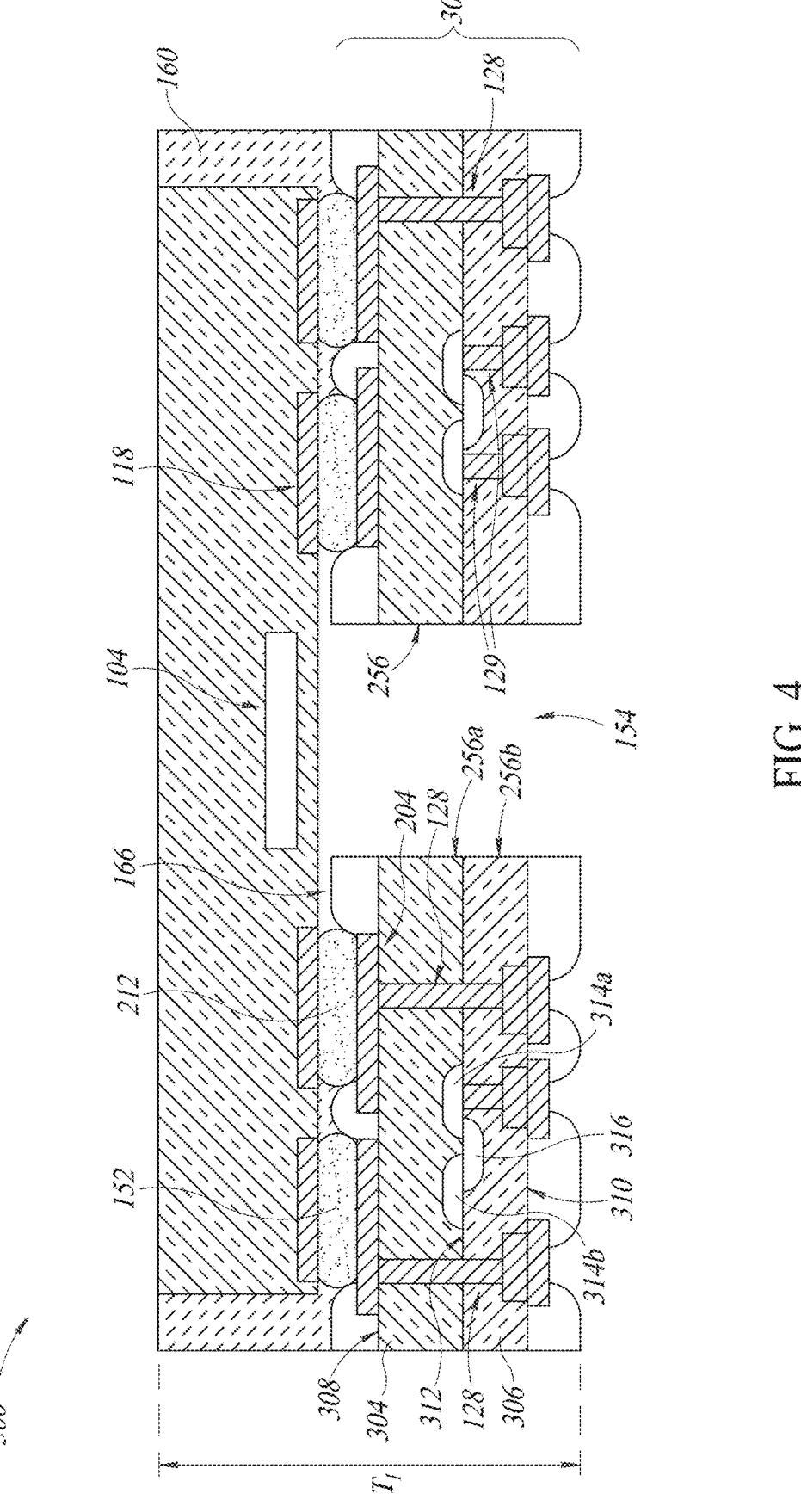
FIG. 4 is a cross-sectional view of an alternative embodiment of a package taken along a line similar to CC-CC in FIG. 3.

FIG. 3 is a top-plan view of the embodiments of the packages 100, 200, respectively, as shown in FIGS. 1A-1B and FIG. 2. The line CC-CC is the line at which the cross-sectional views in FIGS. 1A, 2, and 4 are taken along. The surface 164 of the molding compound 160 surrounds the second surface 108 of the die 102.

FIG. 4 is directed to an alternative embodiment of a package 300 taken along line CC-CC in FIG. 3. An integrated circuit 302 includes a semiconductor substrate 304 and a plurality of second layers 306. The semiconductor substrate 304 may be a silicon substrate, a substrate, or some other substrate material or combination of substrate materials. The second layer 306 may be dielectric materials, non-conductive materials, conductive materials, or some other material or combination of materials. The second layer 306 may be a plurality of layers. The electrical connections 128 extend from a first surface 308 of the first layer to the second surface 310 of the second layer 306 and some other electrical connections 129 extend from the second surface 124 of the substrate 102 to a third surface 312 of the second layer 304 of the substrate. The electrical connections 128 may be through silicon vias (TSVs) that extend through the semiconductor substrate 304 and the second layer 306 of the integrated circuit 302. Otherwise than extending through multiple layers of the substrate 302, the through silicon vias 128 have the same features of the electrical connections 128 described in FIG. 1A.

The electrical connections 128 that extend from the second surface 124 to the third surface 312 of the second layer 306 extend to one of a plurality of doped regions 314a, 314b in the semiconductor substrate 304. The plurality of doped regions 314a, 314b may be n+ (positive) type doped region, n− (negative) type, or some other type of doped region. The plurality of doped regions 314 includes a plurality of source regions 314a and a plurality of drain regions 314b. The plurality of doped regions 314a, 314b is coupled to a plurality of doped regions 316 in the second layer 306, which may be a plurality of gate regions.

A portion 256a of a sidewall 256 of the opening 154 exposes the semiconductor substrate 304 and a portion 256b of the sidewall 256 exposes the second layer 306, which again may be a plurality of layers. The active component and passive components, such as the transistors, the resistors, the capacitors, and other circuit elements that form the circuitry of the integrated circuit die 103, are spaced apart from the sidewall 256 of the opening 154 in a similar fashion as discussed with respect to FIG. 1A above. The semiconductor substrate 304 may be a silicon layer and the second layer 306 may be a plurality of dielectric layers stacked on the semiconductor substrate 304. The semiconductor substrate 304 is exposed by the portion 256a of the sidewall 256 and the second layer 256b is exposed by the portion 256b of the sidewall 256.

Generally, conventional semiconductor device packages include a cap with an opening that is coupled to a substrate by an adhesive to protect and cover a sensor die. The cap may have a coefficient of thermal expansion (CTE) of about 28-ppm/° C., the sensor die may have a CTE of about 2.8-ppm/° C., the adhesive may have a CTE of about 30-ppm/° C., and the substrate may have a CTE of about 14-ppm/° C. The sensor die 102 of the present disclosure being embedded in the molding compound 160, which is shown in FIGS. 1A, 2, and 4, removes the need for the cap and the adhesive of the conventional semiconductor device packages. The molding compound 160 may have a CTE of about 10-ppm/° C. This removal of the requirement of the cap and the adhesive reduces the likelihood of failure due to differences in expansion and contraction, as there are fewer materials in the packages 100, 200, 300 of the present disclosure. Also, the cap and the substrate of the conventional semiconductor device packages have higher CTEs when compared to the CTE of the die, which generally causes the adhesive to fail due to differences in expansion and contraction. This failure in the conventional semiconductor packages may cause the cap to become misaligned or to break off of the substrate entirely. Accordingly, the packages 100, 200, 300 of the present disclosure are advantageous over these conventional semiconductor device packages by removing the need for the substrate, the cap, and the adhesive coupling the cap to the substrate.

Generally, the opening in the cap of the conventional semiconductor package is opposite to the substrate to which the cap is coupled. Unlike the conventional semiconductor package, the opening 154 of the package 100 in FIG. 1A is at the surface of the package 100 that is to be mounted within an electronic device. This provides extra protection from debris entering the opening 154 since there is a relatively small space between the mounting surface of the package 100 and the surface to which the package 100 is mounted. On the other hand, the opening in the cap of the conventional semiconductor device packages is exposed to the majority of internal environment of an electronic device, which increases the likelihood debris may enter the cap. To compensate for this the opening in the cap is made relatively small in comparison to the openings 154 in the integrated circuit die 103 of the package 100. Accordingly, the opening 154 configured in this manner in the package 100 provides greater protection and provides greater exposure to an internal environment of an electronic device than the opening in the cap of the conventional semiconductor device package.

Generally, the conventional semiconductor device packages as discussed above have thickness ranging from 800-μm to 1500-μm. The packages 100, 200, 300 of the present disclosure have thickness T$_1$ ranging from 100-μm to 400-μm. The conventional semiconductor device packages with the cap are thicker because there is a clearance space between the sensor die and the cap. This clearance space increases the profile of the package in the x-direction, the y-direction, and the z-direction as there needs to be a clearance space on all sides between the sensor die and the cap. By removing the need for this clearance space as in the packages 100, 200, 300 of the present disclosure, the packages 100, 200, 300 have a smaller profile in the x-direction, the y-direction, and the z-direction than the conventional semiconductor device packages. Accordingly, the packages 100, 200, 300 are relatively thinner and smaller in profile than the conventional semiconductor device packages. This allows for the packages 100, 200, 300 to take up less space within an electronic device than the conventional semiconductor device packages.

FIGS. 5A-5J are directed to a method of forming the embodiment of the package 100 in FIGS. 1A-1B. The conductive structure 158 as discussed in FIG. 1A protects the cavity 166 and the opening 154 from becoming filled with the molding compound 160, which will now be discussed in greater detail with respect to this method in FIGS. 5A-5J.

A wafer 500 includes a first surface 502 and a second surface 504 opposite to the first surface 502. The plurality of pads 130 are at the second surface 504. In this embodiment, the plurality of pads 130 are recessed in the second surface 504 of the wafer 500. The wafer 500 may be made of a silicon material, a semiconductor material, a non-conductive material, a substrate material, or some other material or combination of materials.

Figures 5A, 5B, 5C:
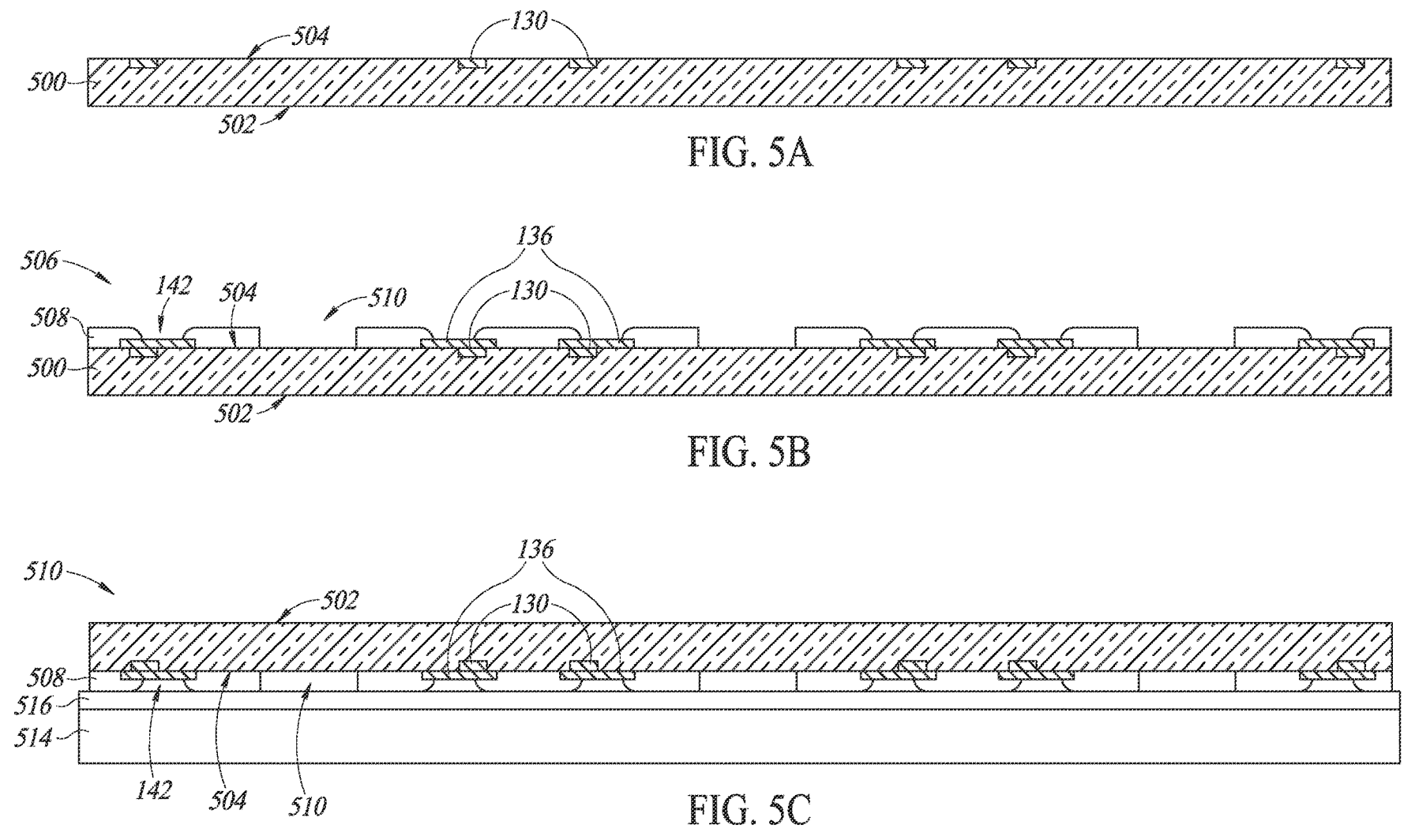

In step 506 the plurality of first conductive layers 136 and a non-conductive layer 508 are formed on the second surface 504 of the wafer 500, which is shown in FIG. 5B.

Each first conductive layer 136 of the plurality of first conductive layers 136 is formed on at least one corresponding pad 130 of the plurality of pads 130. The plurality of first conductive layers 136 may be formed by a sputtering technique, a vapor-deposition technique, a chemical-deposition technique, or some other deposition technique or combination of deposition techniques. If the plurality of first conductive layers 136 are formed utilizing a sputtering technique, a photoresist layer is formed on the second surface and is patterned at which point a conductive material is sputtered onto the photoresist layer. After the conductive material is sputtered on the photoresist layer, the photoresist layer is removed forming the plurality of first conductive layers 136. In some embodiments, the conductive material may be sputtered directly onto the second surface without the photoresist layer and then the conductive material may be etched or patterned to form the plurality of first conductive layers 136.

The non-conductive layer 508 is formed on the second surface 504 of the wafer 500 by a deposition technique such as sputtering, vapor deposition, chemical deposition, or some other deposition technique. If the non-conductive layer 508 is formed utilizing a sputtering technique, the non-conductive layer 508 is formed utilizing a photoresist layer in the same manner as discussed above in forming the plurality of first conductive layers 136. However, when the photoresist layer is removed, a plurality of openings 510 is formed in the non-conductive layer 508 on the second surface 504 of the wafer 500 and are aligned with the plurality of first conductive layers 136, and a plurality of openings 142 is formed in the non-conductive layer exposing portions of the second surface 504 of the wafer 500. Alternatively, the non-conductive layer 508 may be formed on the second surface 504 of the wafer 500 without utilizing the photoresist layer and, instead, patterning with the non-conductive layer 508 by an etching technique, a grinding technique, or some other removal technique to form the pluralities of openings 142, 510 in the non-conductive layer 508. The plurality of openings 142 exposes the plurality of first conductive layers 136.

After step 506 in which the first conductive layers 136 and the non-conductive layer 508 are formed on the second surface 504 of the wafer 500, in step 510 the wafer 500 is flipped utilizing a flip chip technique and the non-conductive layer 508 is coupled to a support 514, which can be seen in FIG. 5C. The wafer 500 is flipped utilizing a flip chip technique and is then placed on an adhesive 516 on a surface 516 of the support 514. The support 514 may be a dummy wafer, a silicon substrate, a support substrate, a kapton tape, or some other support material or combination of support materials as desired.

The adhesive 516 is a temporary adhesive that the non-conductive layer 508 can later be removed. For example, the adhesive 516 may be a die attach film (DAF) adhesive, a glue adhesive, a thermally decomposable adhesive, a water decomposable adhesive, a chemically decomposable adhesive, a air decomposable adhesive, or some other temporary or decomposable adhesive from which the non-conductive layer 508 and the wafer 500 may be removed.

Figures 5D, 5E, 5F:
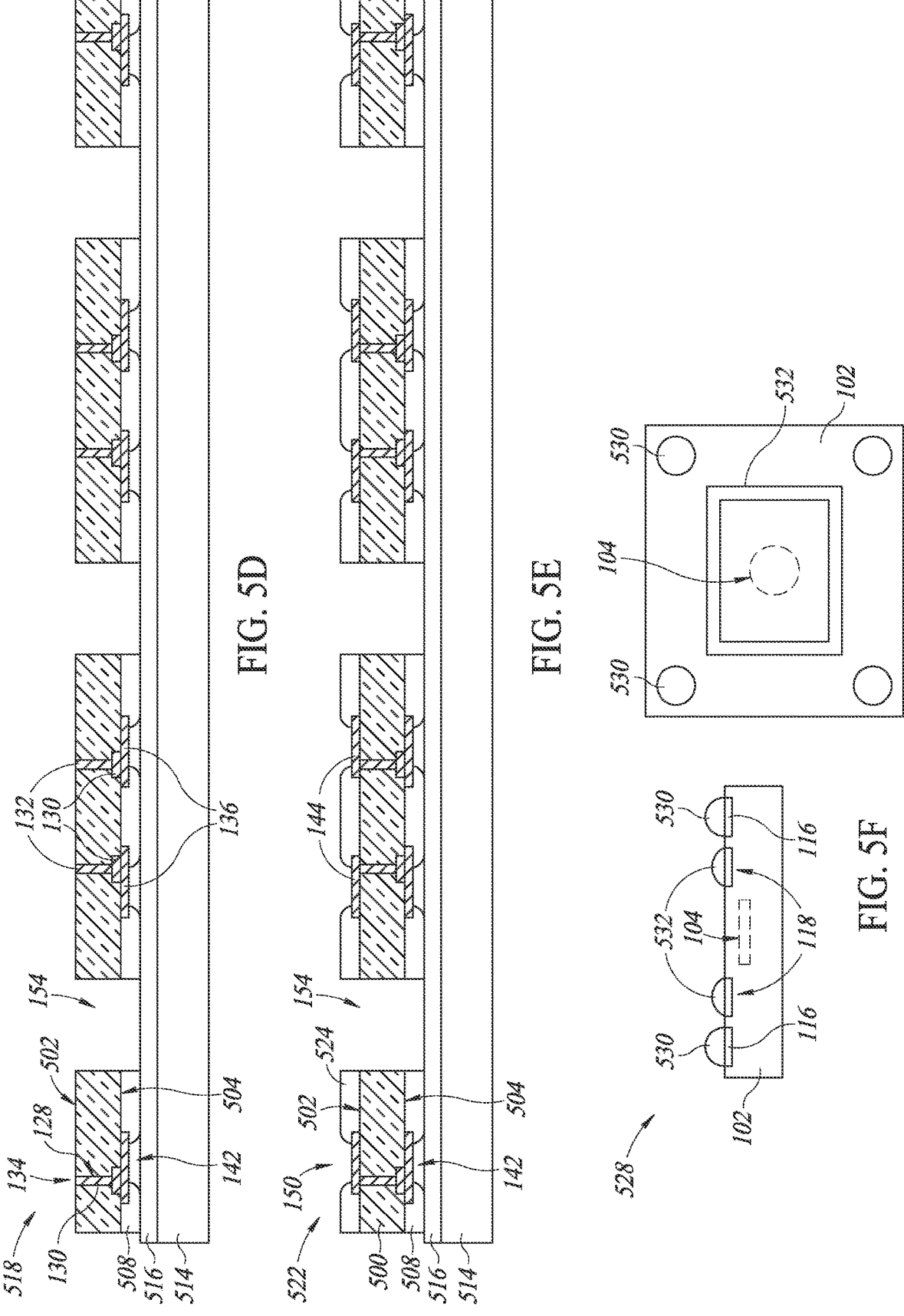

After step 510 in which the non-conductive layer 508 is coupled to the support 514, in step 518 the plurality of openings 154 and a plurality of electrical connections 128 are formed in the wafer 500 that extend from the first surface 502 to the second surface 504, which is shown in FIG. 5D.

The plurality of electrical connections 128 are formed in the wafer 500 by drilling holes into the first surface 502 of the wafer 500 and filling the holes with a conductive material to form the plurality of vias 132 of the plurality of electrical connections 128. The vias 132 have ends 134 that are substantially co-planar or flush with the first surface 502 of the wafer 500.

The plurality of openings 154 is formed to extend through the wafer 500. Each opening 154 extends through the wafer 500 at locations where the first openings 510 were present in the non-conductive layer 508. The plurality of openings 154 may be formed by a grinding technique, a sawing technique, a drilling technique, an etching technique or some other removal technique. If the plurality of openings 154 are formed with an etching technique, a photoresist layer is formed on the first surface 502 of the wafer, the photoresist layer is then patterned to expose portions of the wafer 500 aligned with the first openings 510 in the non-conductive material, and then the wafer 500 is exposed to an etchant to remove the portions of the wafer 500 aligned with the first openings 510. Alternatively, if the plurality of openings 154 are formed utilizing a drilling technique, a drill drills through portions of the wafer aligned with the first openings 510 in the non-conductive layer 508. The openings 154 are formed to extend through the wafer 500 at locations where the wafer is inactive and does not include any electrical or active components. In other words, the openings 154 are formed through inactive portions in the wafer 500. These inactive portions may be referred to as inactive regions, inactive areas, dummy portions, dummy regions, or some other type of region, area, or portion that does not include electrical components or connections.

After step 518 in which the plurality of openings 154 are formed, in step 522 the plurality of second conductive layers 144 and a non-conductive layer 524 are formed on first surface 502 of the wafer 500, which is shown in FIG. 5E. The second conductive layers 144 formed on the first surface 502 of the wafer 500 are formed in the same manner as the first conductive layers 136 on the second surface 504 of the wafer 500. The non-conductive layer 524 formed on the first surface 502 is formed in the same manner as the non-conductive layer 508 on the second surface 504 of the wafer 500. However, in forming the conductive layers 144 and the non-conductive layer 524, the openings 154 are filled with a photoresist layer, which is then later removed when forming both the second conductive layers 144 and the non-conductive layer 524. The plurality of openings 150 are in the non-conductive layer 524 that expose the plurality of second conductive layers 144. Each of the openings 150 exposes at least one of the plurality of second conductive layers 144.

After step 522 in which the plurality of second conductive layers 144 and the non-conductive layer 524 are formed on the first surface 502 of the wafer 500, in step 528 a plurality of first conductive portions 530 is formed on the plurality of contacts 116 of the plurality of die 102 and a second conductive portion 532 is formed on the ring contact pad 118 of the die 102, which is shown in FIG. 5F. The plurality of first conductive portions 530 are utilized to form the plurality of conductive structures 152 in FIG. 1A and the second conductive portions 532 is utilized to form the conductive structure 158. The plurality of first conductive portions 530 may be formed by utilizing a stencil and a conductive material. The stencil is placed on the die 102 and then the conductive material is formed on the stencil to fill opening in the stencil. After the conductive material is formed in the openings of the stencil, the stencil is removed leaving behind the conductive material, which is then reflowed to form the plurality of first conductive portions 530 and the second conductive portion 532. Alternatively, instead of the stencil, a photoresist layer may be formed and patterned on which the conductive material is formed to fill openings aligned with the ring contact pad 118 and the plurality of contacts 116. The conductive material may be a solder material.

Figures 5G, 5H:
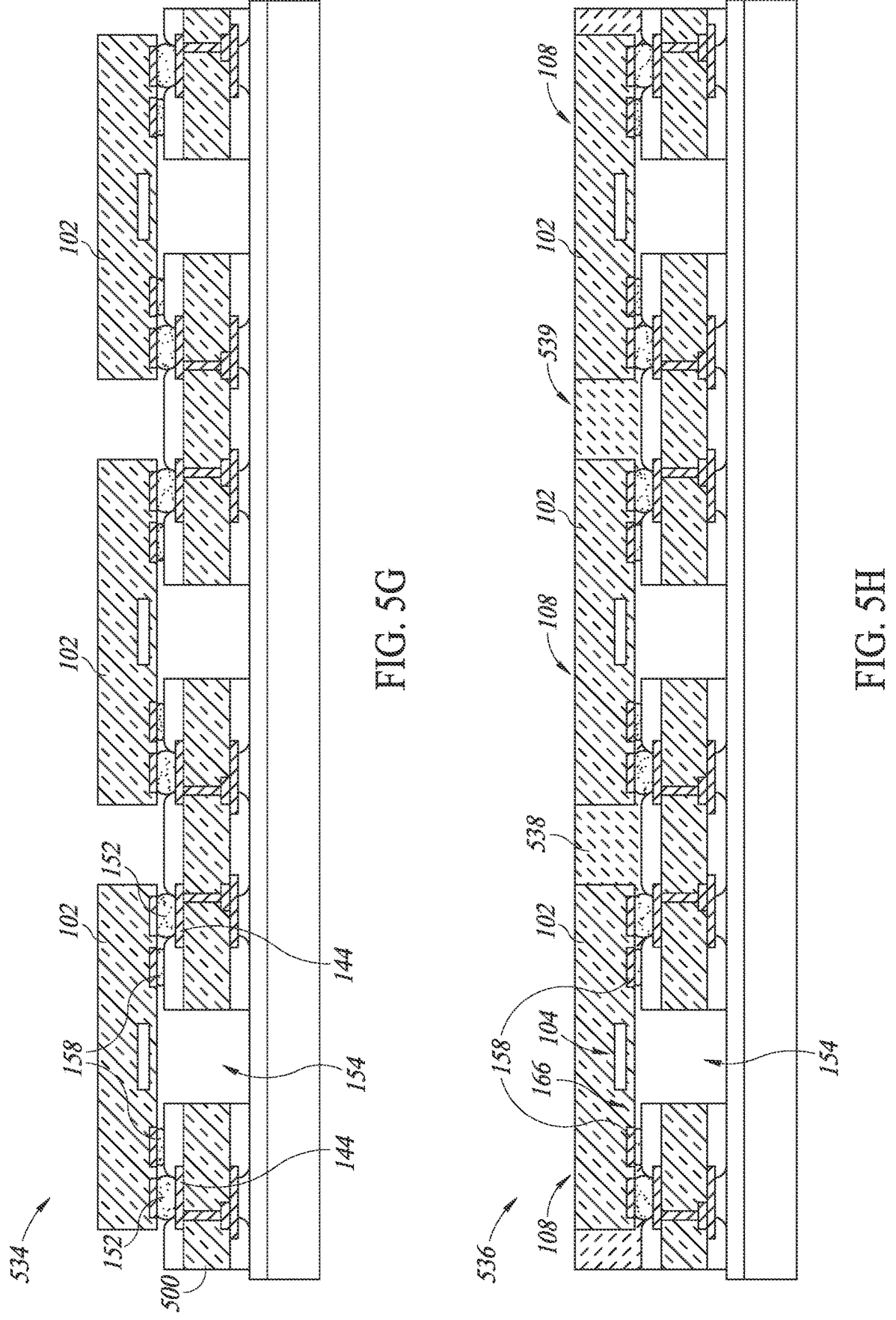

After step 528 in which the plurality of first conductive portions 530 and the second conductive portion 532 are formed, in step 534 the plurality of die 102 are placed on the wafer 500, which is shown in FIG. 5G. A solder paste is applied to the plurality of contacts 116 and then the first plurality of conductive portions 530 are coupled to the solder paste on the plurality of contacts 144 by utilizing a pick and place machine. The plurality of first conductive portions 530 and the second conductive portions 532 are reflowed and the conductive structures 152, 158 are formed.

After step 534 in which the conductive structures 152, 158 are formed and the plurality of die 102 are placed on the wafer 500, in step 536 a molding compound layer 538 is formed to surround the plurality of die 102, which is shown in FIG. 5H. The molding compound layer 538 may be formed by an injection technique, a compression technique, or some other molding compound layer formation technique. When the molding compound layer 536 is being formed though, the conductive structures 158 stop the molding compound layer 538 from reaching or entering the cavities 166 or the openings 154. This stops the molding compound layer 538 from covering the sensing components 104 of the dice 102 as well. This allows the sensing component 104 to be exposed to the external environment of the completed package 100. This also allows the cavities 166 to be wider than the openings 154. The cavities 166 being wider than the openings 154 increases the sensitivity of the sensing component 104 as the sensing component can be exposed to a greater amount of the external environment of the completed package 100. The molding compound layer 538 is formed such that a surface 539 of the molding compound is substantially co-planar or flush with the surfaces 108 of the dice 102.

Figure 5I:
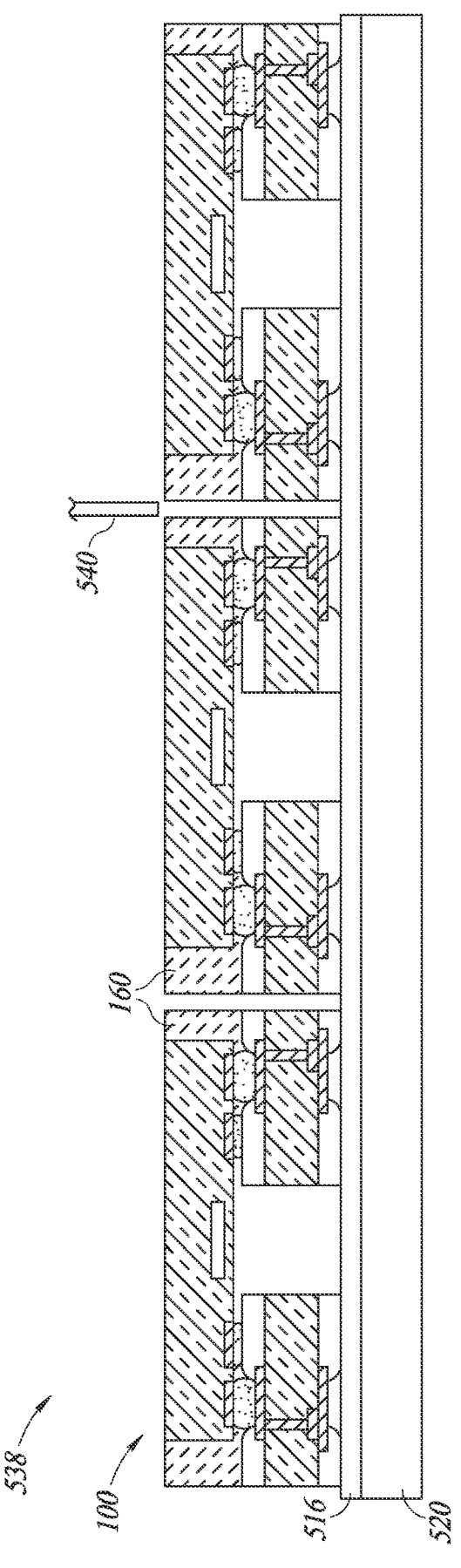

After step 536 in which the molding compound layer 536 is formed, in step 538 the various stacked layers and components as discussed above are singulated into completed packages 100 by a singulation tool 540, which is shown in FIG. 5I. The singulation tool 540 may be a saw, a cutting tool, a grinding tool, a laser cutting tool, or some other singulation tool or singulation device.

After step 538 in which the various stacked layers and components are singluated by the singluation tool 540, the completed pacakges 100 are removed from the adhesive 516 and the support 520. The completed pacakges 100 may be removed by decomposing the adhesive and removing them by a pick and place machine, or by simply removing them with a pick and place machine alone.

Figure 5J:
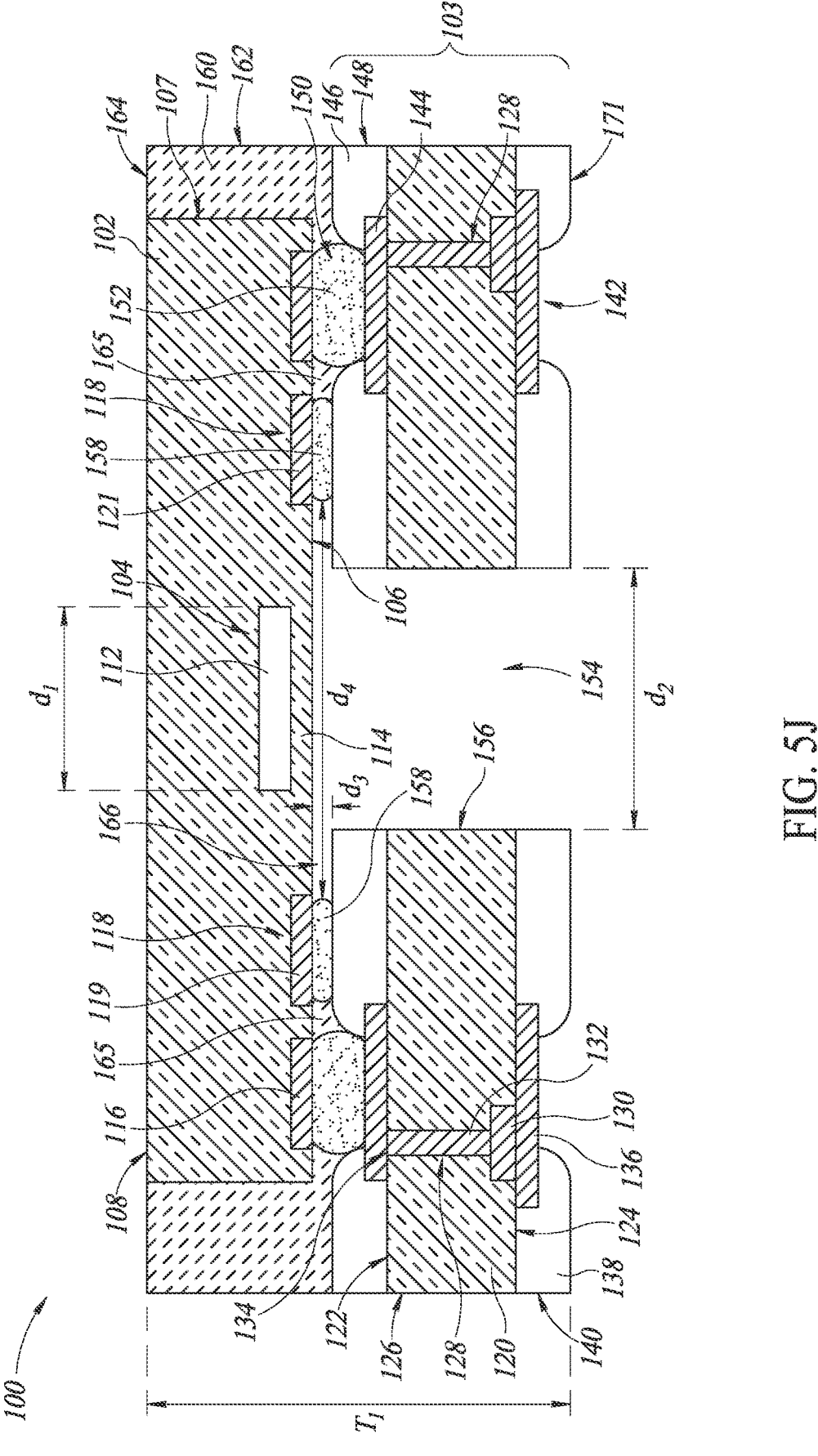

FIG. 5J is the completed package 100 formed by the embodiment of the method illustrated in FIGS. 5A-5I.

Figures 6, 7:
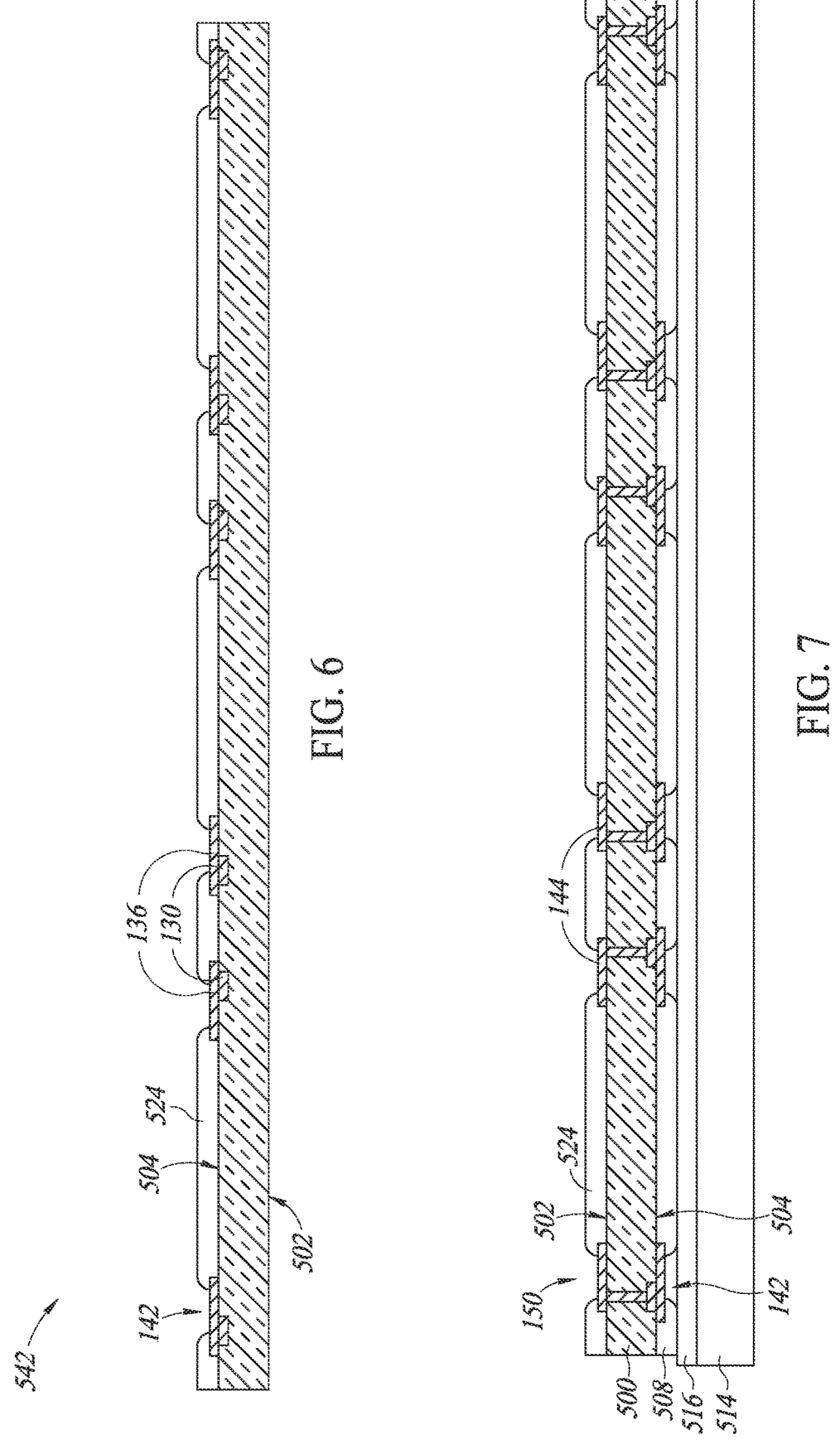
FIG. 6 is an alternative step for an alternative embodiment of a method of manufacturing.
FIG. 7 is an alternative step for an alternative embodiment of a method of manufacturing.

FIG. 6 is directed to an alternative step 542 of an alternative method of forming the completed package 100. The step 542 replaces step 506 in FIG. 5B. In step 542, the non-conductive layer 508 is formed on the second surface of the wafer 500 to cover the entirety of the second surface 504. The non-conductive layer 508 is not patterned and is instead removed when forming the openings in step 518 in FIG. 5D.

FIG. 7 shows that in another alternative step 544, the non-conductive layer 524 formed on the first surface 502 of the wafer 500 may be formed on the first surface 502 before step 518 in which the openings 154 are formed. Then the non-conductive layer 524 is removed when forming the openings 154 in step 518. The step 544 would occur before step 518 in FIG. 5D in which the openings 154 are formed.

The methods described herein may provide many advantages over conventional methods of forming conventional semiconductor device packages. For example, coupling a sensor die directly to a substrate (e.g., an ASIC, an integrated circuit, or other device having active components, etc.) and encasing the sensor die with a molding compound removes the requirement of a cap and an adhesive of the conventional semiconductor device packages. This results in the packages 100, 200, 300 of the present disclosure being relatively thinner and relatively smaller in profile when compared to the conventional semiconductor device packages that utilize a cap.

Another advantage of the methods described herein of the present disclosure is the increased allowable tolerances over the conventional methods of forming the conventional semiconductor device packages. For example, no bonding wires are required in the packages 100, 200, 300 of the present disclosure, whereas bonding wires may couple a sensor die to an ASIC die in the conventional semiconductor device packages, which increases the overall thickness of the conventional semiconductor device packages. In addition, the formation of bonding wires is relatively costly as high-precision machines must be utilized to form the bonding wire connections. Similarly pick and place machines must be utilized to couple the cap to the ASIC die in the conventional semiconductor device packages. The pick and place machines are also high-precision machines as well, however, as the packages 100, 200, 300 are protected by a molding compound instead of the cap in the conventional semiconductor device packages, this extra pick and place step is not required. Also, even if the molding compound is a little off, the packages 100, 200, 300 of the present disclosure are likely still usable, whereas if the cap of the conventional semiconductor device packages is off, the conventional semiconductor device packages are likely unusable. Accordingly, the yield of usable packages 100, 200, 300 of the present disclosure is increased relative to the method of forming the conventional semiconductor device packages.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first die including a first surface, a second surface opposite to the first surface, sidewalls extending between the first surface and the second surface, and an opening extending through the first die from the first surface to the second surface, the opening extending through a central portion of the first die and including at least one sidewall that delimits the opening, the first die having a first ring-contact that surrounds the opening and one or more first contact pads that are spaced laterally outward from the first ring-contact;
a space extending outward from the at least one sidewall of the opening towards the sidewalls of the first die;
a second die being on the first die, the second die including a third surface, a fourth surface opposite to the third surface, one or more sidewalls extending form the third surface to the fourth surface, and a sensing component at the third surface being aligned with the opening in the first die, the second die having a second ring-contact that surrounds the sensing component and that is aligned with the first ring-contact of the first die and one or more second contact pads spaced laterally outward from the second ring-contact, and each respective second contact pad of the one or more second contact pads is aligned with a respective first contact of the one or more first contact pads;
a molding compound being on the third surface of the second die and between the first die and the second die, the molding compound being on the one or more sidewalls of the second die;
a conductive ring-structure that extends from the first ring-contact to the second ring-contact and couples the first ring-contact to the second ring-contact, the conductive ring-structure surrounds the first opening; and
one or more conductive structures that couple the one or more first contact pads to the one or more second contact pads, the one or more conductive structures being spaced outward from the conductive ring-structure.

2. The device of claim 1, wherein the molding compound is on the conductive ring-structure, the surface of the conductive ring-structure is between the first surface of the first die and the third surface of the second die.

3. The device of claim 1, wherein the first ring-contact on the first surface of the first die is coupled to an electrical connection that extends through the first die to the second surface of the first die.

4. The device of claim 1, wherein the opening has a first dimension between a first sidewall and a second sidewall of the sidewalls of the first die, the second sidewall being opposite to the first sidewall, the sensing component has a second dimension between a third sidewall and a fourth sidewall of the second die, the fourth sidewall being opposite to the third sidewall, and the first dimension is greater than the second dimension.

5. The device of claim 1, wherein the sensing component is a pressure sensor that includes a surface that is spaced from the third surface of the second die.

6. The device of claim 1, wherein:
the opening has a first dimension that is between opposing points along the at least one sidewall that delimits the opening; and

the sensing component has a second dimension, and the first dimension is greater than the second dimension.

7. The device of claim 1, wherein the one or more conductive structures are one or more solder balls.

8. The device of claim 2, wherein:

the conductive ring-structure includes a first side and a second side, the first side is closer to the opening than the second side; and the molding compound physically contacts and at least partially covers the second side of the conductive ring-structure.

9. A device, comprising:

a first die including an opening extending through a central portion of the first die, the first die further including:

a first surface;

a second surface opposite to the first surface;

a plurality of first contacts on the first surface; and a first ring-contact that is between the first plurality of contacts and the opening, the first ring-contact is spaced laterally inward from the plurality of first contacts, and the first ring-contact surrounds the opening;

a second die on the first die, the second die including a sensing component aligned with the opening in the first die, the second die further including:

a third surface;

a fourth surface opposite to the third surface;

a plurality of second contacts on the third surface, each respective second contact of the plurality of second contacts is aligned with a corresponding first contact of the plurality of first contacts;

one or more sidewalls extending from the third surface to the fourth surface; and a second ring-contact that is between the plurality of second contacts and the sensing component, the second ring-contact is spaced laterally inward from the plurality of second contacts, the second ring-contact is aligned with the first ring-contact, and the second ring-contact surrounds the sensing component;

a plurality of solder balls couple the first plurality of contacts to the second plurality of contacts, each respective solder ball of the plurality of solder balls couple each respective first contact of the plurality of first contacts to a corresponding second contact of the plurality of second contacts;

a ring-solder structure is between the first die and the second die, the ring-solder structure couples the first ring-contact to the second ring-contact, and the ring-solder structure is between the opening of the first die and the plurality of solder balls; and a molding compound being on the third surface of the second die and between the first die and the second die, the molding compound being on the one or more sidewalls of the second die, the molding compound enclosing the plurality of solder balls, and the molding compound contacting the ring-solder structure.

10. The device of claim 9, wherein the sensing component is a pressure sensor that includes a surface that is spaced from the third surface of the second die.

11. The device claim 9, further comprising a space extending between the first surface and the third surface and extending between the ring-solder structure and the opening, the space surrounding the opening and the sensing component, and the space being in fluid communication with the opening.

12. The device of claim 9, wherein:

the opening has a first dimension extending across the opening;

the sensing component has a second dimension extending across the sensing component;

the space having a third dimension extending across the space and between the ring-solder structure;

the first dimension being greater than the second dimension; and the third dimension being greater than the first dimension and the second dimension.

13. The device of claim 9, wherein the first die includes an inactive region at the central portion of the first die, the opening having a first dimension extending across the opening, the inactive region having a second dimension extending across the inactive region, the second dimension being greater than the first dimension.

14. The device of claim 9, wherein the sensing component is a moveable electrode.

15. A device, comprising:

a first die including a first surface, a second surface opposite to the first surface, one or more outer sidewalls extending between the first surface and the second surface, and an opening extending through the first die from the first surface to the second surface, the opening extending through a central portion of the first die and including at least one inner sidewall that delimits the opening, the at least one inner sidewall being spaced inward from the one or more outer sidewalls, the first die including a first ring-contact that is along the first surface and that surrounds the opening, the first die including a plurality of first contact pads along the first surface, each respective first contact pad of the plurality of first contact pads is spaced laterally outward from the first ring-contact, and the first die includes a non-conductive layer along the first surface, and the first die including a first sidewall transverse to the first surface and the second surface, and the first sidewall is partially defined by the non-conductive layer;

a second die being on the first die, the second die including a third surface, a fourth surface opposite to the third surface, one or more sidewalls extending form the third surface to the fourth surface, and a sensing component at the third surface being aligned with the opening in the first die, the second die including a second ring-contact that is along the third surface and that surrounds the sensing component, the second ring-contact is aligned with the first ring-contact of the first die, the second die including a plurality of second contact pads along the third surface, each respective second contact pad of the plurality of second contact pads is spaced laterally outward from the second ring-contact, and each respective second contact pad of the plurality of second contact pads is aligned with a corresponding first contact pad of the plurality of first contact pads;

a solder ring-structure extends from the first ring-contact to the second ring-contact and couples the first ring-contact to the second ring-contact, the solder ring-structure includes a first side further from the opening and a second side close to the opening;

a space extending outward from the at least one inner sidewall of the opening towards the one or more outer sidewalls of the first die and extends to the solder ring-structure, the space being delimited by the first surface of the first die, third surface of the second die, and the solder ring-structure;

a plurality of solder balls between the first surface of the first die and the second surface of the second die, the plurality of solder balls couple the plurality of first contact pads to the plurality of second contact pads; and a molding compound being on the third surface of the second die and between the first die and the second die, the molding compound being on the one or more sidewalls of the second die, the molding compound including a second sidewall coplanar with the first sidewall of the first die, the molding compound enclosing the plurality of solder balls, and the molding compound covering the first side of the solder ring-structure.

16. The device of claim 15, wherein the first ring-contact, the second ring-contact, and the solder ring-structure have a rectangular shape.

17. The device of claim 16, wherein the rectangular shape is a square shape.

18. The device of claim 16, wherein the first ring-contact on the first surface of the first die is coupled to an electrical connection that extends through the first die to the second surface of the first die.

19. The device of claim 18, further includes an external contact pad that is on the second surface of the first die and is coupled to the electrical connection.

20. The device of claim 15, wherein the first ring-contact on the first surface of the first die is coupled to an electrical connection that extends through the first die to the second surface of the first die.

* * * * *